(12) United States Patent
Russ et al.

(10) Patent No.: US 8,476,709 B2
(45) Date of Patent: Jul. 2, 2013

(54) ESD PROTECTION DEVICE AND METHOD

(75) Inventors: Cornelius Christian Russ, Diedorf (DE); David Alvarez, Essex, VT (US)

(73) Assignee: Infineon Technologies AG, Neubiberg (DE)

( * ) Notice: Subject to any disclaimer, the term of this patent is extended or adjusted under 35 U.S.C. 154(b) by 645 days.

(21) Appl. No.: 11/509,366

(22) Filed: Aug. 24, 2006

(65) Prior Publication Data

US 2008/0048266 A1  Feb. 28, 2008

(51) Int. Cl.
    *H01L 23/62* (2006.01)
(52) U.S. Cl.
    USPC .................................. 257/355; 257/356
(58) Field of Classification Search
    USPC .................................. 257/355–363
    See application file for complete search history.

(56) References Cited

U.S. PATENT DOCUMENTS

| | | | | |
|---|---|---|---|---|
| 4,559,694 A * | 12/1985 | Yoh et al. | | 438/275 |
| 4,745,079 A * | 5/1988 | Pfiester | | 438/306 |
| 4,760,434 A * | 7/1988 | Tsuzuki et al. | | 257/49 |
| 5,438,007 A * | 8/1995 | Vinal et al. | | 438/289 |
| 5,536,958 A | 7/1996 | Shen et al. | | |
| 5,753,952 A * | 5/1998 | Mehrad | | 257/316 |
| 5,977,591 A * | 11/1999 | Fratin et al. | | 257/344 |
| 6,172,383 B1 * | 1/2001 | Williams | | 257/173 |
| 6,232,163 B1 | 5/2001 | Voldman et al. | | |
| 6,617,649 B2 | 9/2003 | Chang et al. | | |
| 6,690,065 B2 | 2/2004 | Chang et al. | | |
| 6,768,149 B1 * | 7/2004 | Mann et al. | | 257/292 |
| 2002/0000618 A1 * | 1/2002 | Saito et al. | | 257/368 |
| 2002/0195657 A1 | 12/2002 | Williams et al. | | |
| 2006/0209479 A1 | 9/2006 | Grombach et al. | | |

FOREIGN PATENT DOCUMENTS

DE  10 2005 013687 B3  12/2005
WO  WO 02/09115  1/2002

OTHER PUBLICATIONS

Amerasekera, A., et al. "ESD in Silicon Integrated Circuits," Chapter 6, John Wiley & Sons, Ltd. (2$^{nd}$ Edition), 2002.

* cited by examiner

*Primary Examiner* — Ori Nadav
(74) *Attorney, Agent, or Firm* — Slater & Matsil, L.L.P.

(57) ABSTRACT

An ESD protection device includes an MOS transistor with a source region, drain region and gate region. A node designated for ESD protection is electrically coupled to the drain. A diode is coupled between the gate and source, wherein the diode would be reverse biased if the MOS transistor were in the active operating region.

18 Claims, 6 Drawing Sheets

ESD PROTECTION DEVICE AND METHOD

TECHNICAL FIELD

This invention relates generally to semiconductor devices, and more particularly to an ESD protection device and method.

BACKGROUND

As electronic components are getting smaller and smaller along with the internal structures in integrated circuits, it is getting easier to either completely destroy or otherwise impair electronic components. In particular, many integrated circuits are highly susceptible to damage from the discharge of static electricity. Electrostatic discharge (ESD) is the transfer of an electrostatic charge between bodies at different electrostatic potentials (voltages), caused by direct contact or induced by an electrostatic field. The discharge of static electricity, or ESD is a critical problem for the electronics industry.

Device failures that result from ESD events are not always immediately catastrophic or apparent. Often, the device is only slightly weakened but is less able to withstand normal operating stresses and, hence, may result in a reliability problem. Therefore, various ESD protection circuits must be included in the device to protect the various components.

When an ESD pulse occurs on a transistor, the extremely high voltage of the ESD pulse can break down the transistor and can potentially cause permanent damage. Consequently, the input/output pads of an integrated circuit need to be protected from ESD pulses so they are not damaged.

Integrated circuits and the geometry of the transistors which comprise the integrated circuits continue to be reduced in size and the transistors are arranged closer together. A transistor's physical size limits the voltage that the transistor can withstand without being damaged. Thus, breakdown voltages of transistors are lowered and currents capable of overheating components are more frequently reached by the voltages and currents induced by an ESD event. Additionally, recent advances in technology have produced devices which can fail at voltage levels lower than the triggering voltages of known ESD protection circuits. Thus, there is a need for improved ESD protection circuits with lower triggering voltages.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION

The making and using of the presently preferred embodiments are discussed in detail below. It should be appreciated, however, that the invention provides many applicable inventive concepts that can be embodied in a wide variety of specific contexts. The specific embodiments discussed are merely illustrative of specific ways to make and use the invention, and do not limit the scope of the invention.

The invention will be described with respect to preferred embodiments in a specific context, namely a NMOS ESD structure. The invention may also be applied, however, to other semiconductor structures.

Before discussing details of preferred embodiments, it will be instructive to consider prior art ESD protection structures. Much of the discussion with respect to FIGS. 1-3 also applies to embodiments of the invention, and, as a result, various details will not be repeated.

Figure 1:
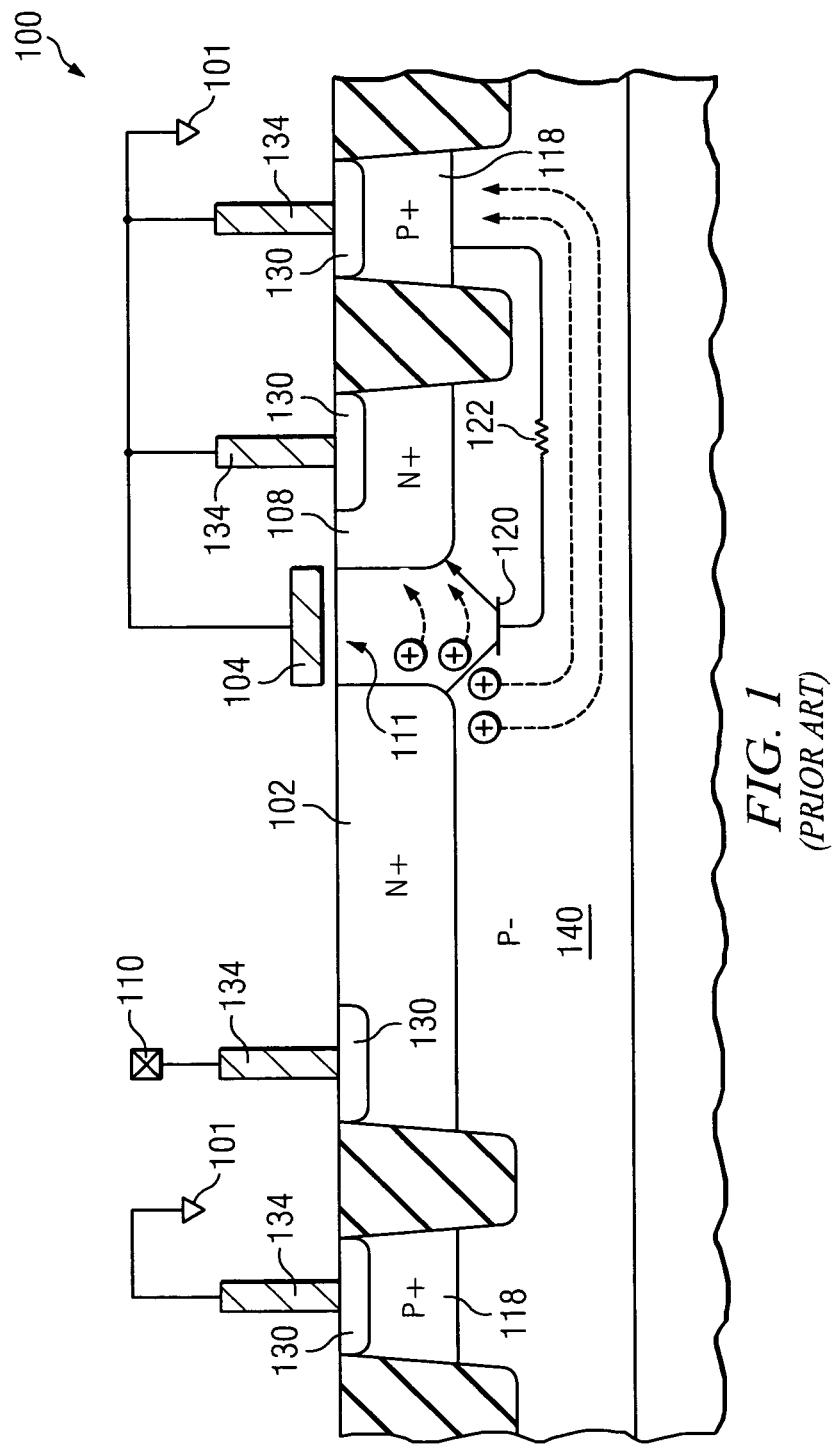
FIG. 1 is a cross sectional view of conventional ESD protection structures.

FIG. 1 illustrates a known ESD protection device 100. This device includes an NMOS transistor with drain and source regions 102 and 108. A gate 104 overlies a channel region 111 between the source 108 and the drain 102. Bulk contact regions 118 are provided to allow electrical contact to the p-well region 140. Contacts 134 provide electrical contact to the doped regions 102, 108, and 118. Each of these contacts is formed over a silicide region 130. In the case of the drain region 102, the silicide region 130 does not extend over the entire doped region 102.

Figure 2A:
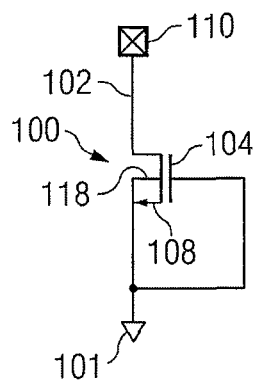
FIGS. 2a-2b are circuit diagrams of conventional ESD structures.

Typically the device is connected as shown in the circuit diagram of FIG. 2a. An external pad 110 is connected to drain 102, while the gate 104, source 108 and substrate 118 are connected to ground 101.

The structure of FIG. 1 is a standard silicide-blocked NMOS device. Typical current flow lines are indicated at the snapback trigger point. Junction breakdown occurs at the junction sidewall (between drain 102 and p-well 140) and generated holes drift to the bulk contact regions 118 while turning on the parasitic bipolar transistor 120 (formed by n-region 102/p-region 111 and parts of p-well 140/n-region 108). The trigger voltage is relatively high, typically between 6 and 10 V.

This structure has a number of drawbacks. The ESD trigger voltage is too high to adequately protect devices fabricated on fine geometry processes. There is also a tendency to encounter multi-finger trigger problems because of variation in the parasitic substrate resistance 122 which generates different base voltages at the base of the parasitic transistor 120.

Figure 2B:
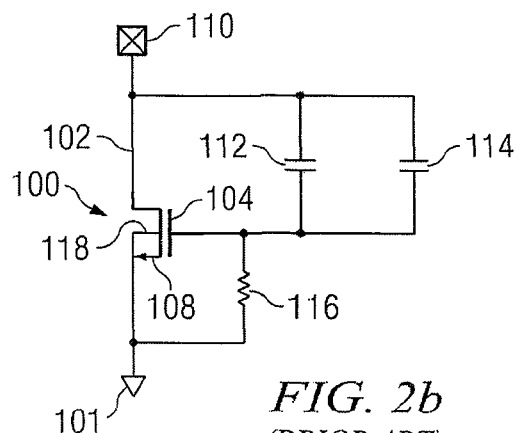

One possible conventional solution used to reduce the trigger voltage of the ESD device is shown in the circuit diagram of FIG. 2b. In the figure, a standard silicide-blocked NMOS device is shown. Instead of connecting the gate 104 to ground 101 as is shown in FIG. 1, a resistor 116 is connected between the gate 104 and ground 101. An external capacitor 114 is coupled between the drain 102 and gate 104 of the device 100. This capacitor is typically a gate-oxide capacitor, but it could also comprise a metal-metal capacitor, poly-poly cap, sandwich cap, or any other capacitor structures thereof. Capacitor 112 represents the internal parasitic drain to gate capacitance that is inherent within the device 100. The resistor 116 is connected between the gate 104 and ground 101 biases the gate 104 to ground potential during normal, non-ESD operation.

The conventional solution of FIG. 2b facilitates a lower ESD trigger voltage by coupling the drain 102 to the gate 104 with a capacitance 114. When the drain 102 of the device experiences a positive high-voltage transient, a portion of the transient is coupled to the gate via capacitance 114 and parasitic gate-drain capacitance 112, thereby temporarily turning on the MOS device. This MOS device facilitates easier triggering of the parasitic bipolar device 120 (see FIG. 1). The operation of the MOS device thereby lowers the ESD trigger voltage for dynamic signals. The DC characteristics for static drain voltages, however, are identical to the device depicted in the circuit diagram in FIG. 2a.

The ability of the solution depicted in FIG. 2b to reduce the dynamic ESD trigger voltage depends on the RC time constant of the gate-drain capacitance which is approximately the sum of the external capacitance 114 and parasitic capacitance 112 multiplied by the gate-to-ground resistance 116, or $(C_{114}+C_{112})*R_{116}$. When the drain 102 voltage of the device 100 is dynamically increased during an ESD event, a portion of the signal is fed through the drain-gate capacitance 112/114 to the gate 104, thereby raising the voltage at the gate 104. After the ESD event, the capacitance present at the gate 104 is charged by resistance 116. For high RC time constants, the gate voltage charges slowly to ground, so device 100 stays on longer, thereby making it more effective at shunting the current during an ESD transient. For low RC time constants, however, the gate voltage decays to ground potential quicker, thereby turning off the device 100 sooner, and making the device 100 less effective at shunting current during ESD transients.

While the solution shown in FIG. 2b can be made to be effective at lowering the transient ESD threshold of device 100, the solution still suffers from a number of problems. For most sub-micron processes, resistance 116 can typically be made on the order of a few tens of K-ohms for a reasonable size. These resistors are typically fabricated with non-silicided polysilicon or with implanted silicon. To keep the RC time constant high, capacitor 114 must be made sufficiently large enough not to be charged too quickly by resistance 116. A large capacitance present between the drain and gate of device 100 suffers from two disadvantages. First, the capacitor 114 can be physically large. In some cases the physical layout area taken up by the capacitor can be an area the size of a bond pad. Second, the presence of a large capacitance at the drain capacitively loads the bond pad 110 making the ESD structure unusable in RF and high-frequency applications requiring low-capacitance inputs.

Various methods for the formation of ESD protection devices using these concepts will be described with respect to FIGS. 3a-3b, FIGS. 4a-4c, FIGS. 5a-5b, and FIGS. 6a-6b.

Figure 3A:
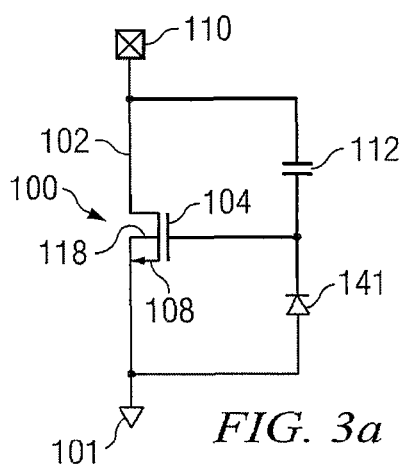
FIGS. 3a-3b are circuit diagrams of an embodiment ESD structure.

Turning to FIG. 3a, a circuit diagram representing the one embodiment of the present invention is shown. Device 100 is a silicide blocked ESD protection NMOS transistor. An external pad 110 is coupled to drain 102, and the gate 104 is coupled to ground 101 via a diode 141. The polarity of the diode is such that the diode would be reverse biased if the MOS transistor were biased in the active operating region. Capacitance 112 represents the parasitic drain-gate capacitance inherent in the device.

The embodiment of FIG. 3a creates a high RC time constant by using a reverse-biased polysilicon diode 141 instead of resistance 116 (see FIG. 2b) of the conventional solution. While a polysilicon resistor or a diffusion resistor may be on the order of a few 10's of K-Ohms, the resistance of a reverse-biased polysilicon diode can be on the order of a few M-ohms. Because of the large resistance of the polysilicon diode 141, the parasitic drain-gate capacitance 112 is sufficient to create the required time constant and an external capacitor is not required.

Dimensioning of the capacitance 112 and the resistance of the diode 141 should be done in accordance with the RC-time constant of a typical ESD discharge event, e.g., about 150 ns. For example, for a typical drain-gate overlap capacitance of 0.3 fF/um and a typical device size width of 200 um, the typical reverse resistance of the diode should be 150 ns/60 fF=2.5 MOhms. There should also be sufficient reverse bias current in the diode to discharge the capacitance 112 and bring the gate 104 back down to ground potential after an ESD event.

Figure 3B:
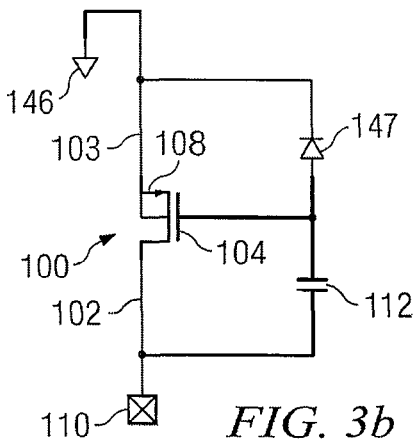

While the ESD protection device described shown in the circuit diagram of FIG. 3a uses an NMOS transistor, an ESD device, alternatively, can also be constructed with a PMOS transistor as shown in FIG. 3b. Pad 110 is coupled to the drain 102 of a PMOS transistor 103 whose source 108 is coupled to a power supply 146 and whose gate 104 is coupled to the power supply via a reverse-biased polysilicon diode 147. The gate drain overlap capacitance is represented by capacitance 112. The operation of the PMOS ESD device is similar in operation to the NMOS ESD device discussed herein above, except that the device will turn on when the voltage on pad 110 is driven below the power supply 146 by a negative voltage that exceeds the ESD trigger voltage of the device.

Figure 4A:
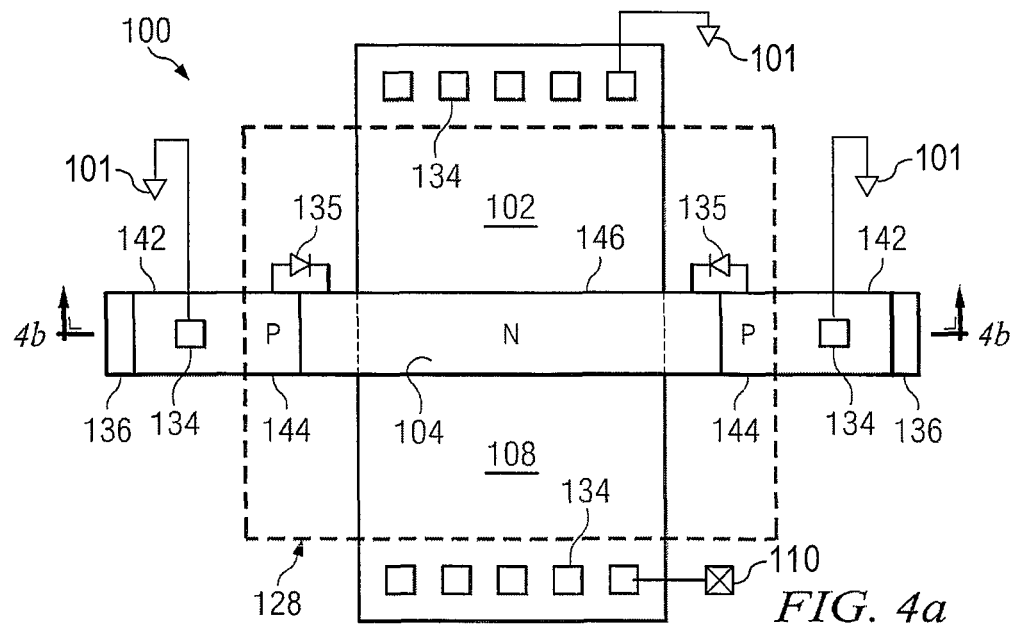
FIGS. 4a-4d contain a layout view and cross sectional views of an ESD structure.
Figure 4B:
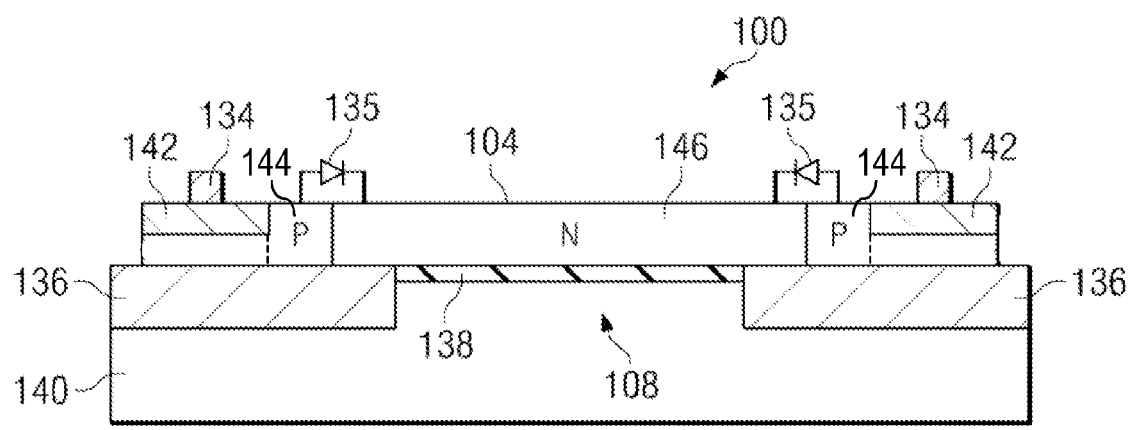

FIG. 4a shows a top layout view of an embodiment of the present invention. FIG. 4b illustrates a cross-section of the device of FIG. 4a taken though the gate 104. The device comprises a source region 108 and a drain region 102. The drain and source regions 102/108 typically contain n-type doping and are silicided near the source and drain contacts 134. The drain area 102 is elongated with respect to the source area 108 and silicide blocking region 128 is provided to increase the series resistance of the drain 102, thereby introducing ballast resistance in the drain.

In the embodiment of FIG. 4a, the gate region comprises a silicided p-type polysilicon region 142 near the contacts 134. Adjacent to the silicided p-type polysilicon regions are p-type non-silicided regions 144. Over the active area of the device, however, the gate region comprises n-type polysilicon 146. For most NMOS and PMOS devices, especially non-ESD devices, the polysilicon gate typically receives implants to adjust the work function and subsequently the threshold voltage of the MOS device. NMOS gates typically receive n-type implants during an n+ source/drain implant, and PMOS gates typically receive p-type implants during a p+ source/drain implant. The interface between the non-silicided n-type and p-type polysilicon gate regions form diode junctions 135. If a high enough doping concentration is used for the n-type and p-type polysilicon regions, the reverse leakage current of the formed diode is high enough to discharge the drain-gate capacitance 112 effectively (shown schematically in FIG. 3a). Typical n-doping and p-doping concentrations are $1\times10^{18}$ to $1\times10^{21}$ cm$^{-3}$. In an embodiment, source region 108 is coupled to ground 101, gate 104 is coupled to ground 101 via p-type non-silicided regions 144, and drain region 102 is coupled to pad 110.

Focusing now on the cross section shown in FIG. 4b. The cross section is drawn along a center line of the gate. As shown in the cross section diagram, a p-well 140 is provided, and a gate dielectric 138 is disposed over a channel region 111. In embodiments of the present invention, shallow trench isolation (STI) regions 136 border the channel region (and, in fact, surround the active area of the cell). The figure also shows the placement of the p-type region 144, the silicided p-type region 142 and the n-type region 146. The diodes formed by the abutment of the n-type regions 146 and p-type region 144 are represented by diode symbols 135. When gate contacts 134 are connected to ground, the circuit diagram of FIG. 3a is implemented. N-type region 146 acts as the cathode of the polysilicon diode 135 and p-type region 144 acts as the anode of the polysilicon diode 135.

Figure 4C:
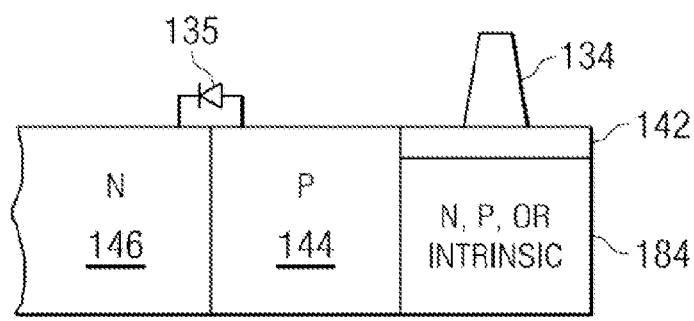

FIG. 4c shows a detailed view of the end of the gate region for an alternate embodiment of the present invention. As in the embodiment discussed herein above, a diode 135 is formed by the abutment of n-type region 146 and p-type region 144. Silicide region 142, however, touches the p-type region 144 on the edge, making an electrical contact. Silicide region 142 can be disposed over n-type, p-type, or undoped or "intrinsic" polysilicon gate material.

Figure 4D:
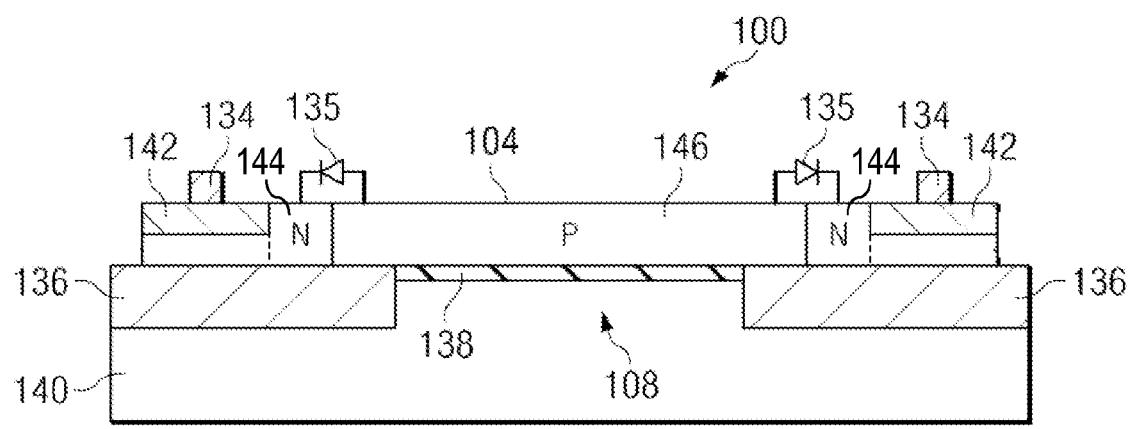

The layout and cross section of embodiments of the present invention has so far been described in terms of an NMOS ESD device. In an alternate embodiment shown in FIG. 4d, the ESD device can be implemented as a PMOS device. The PMOS device implementation includes an n-well region 140, n-type region 144, p-type region 146, and n-type silicided regions 142. The junctions formed by p-type region 146 and n-type region 144 form polysilicon diodes 135 with a polarity opposite that of those depicted in FIG. 4b.

Figure 5A:
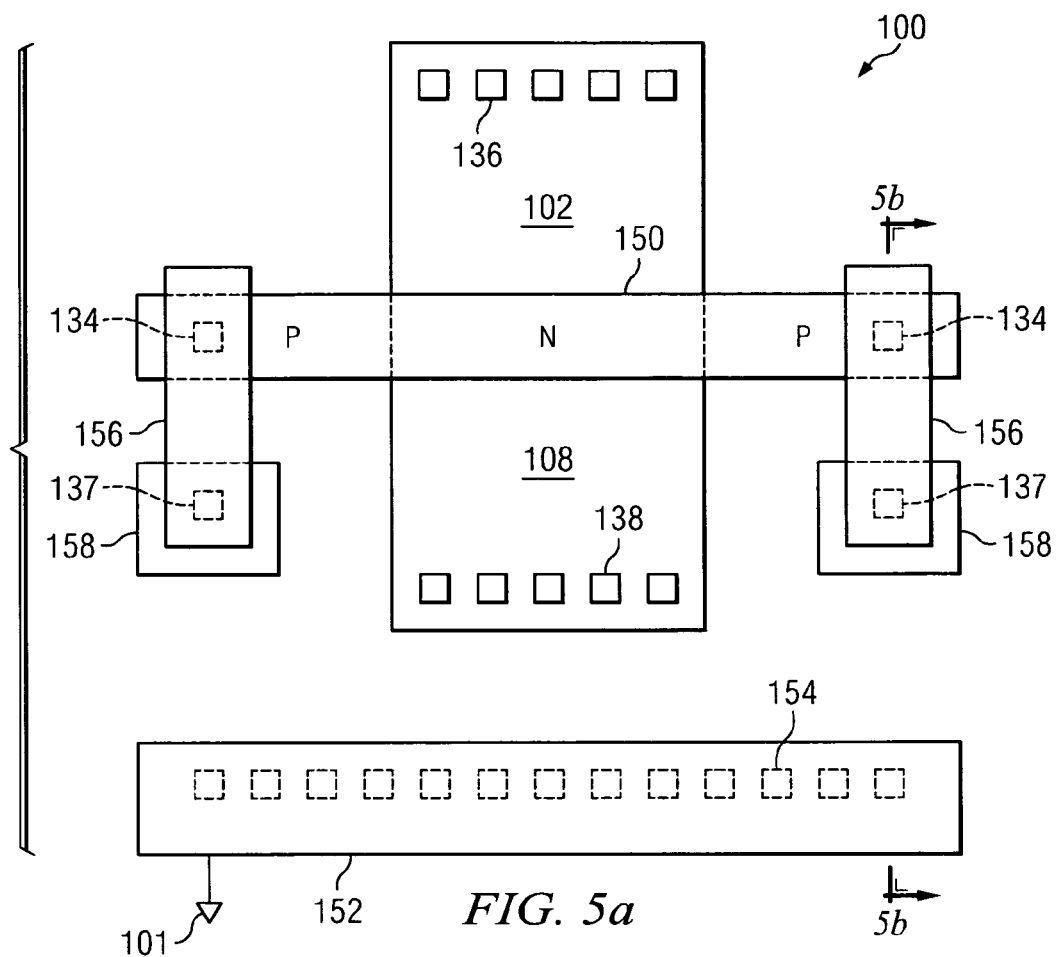
FIGS. 5a-5b contain a layout view and a cross sectional view of another embodiment ESD structure.
Figure 5B:
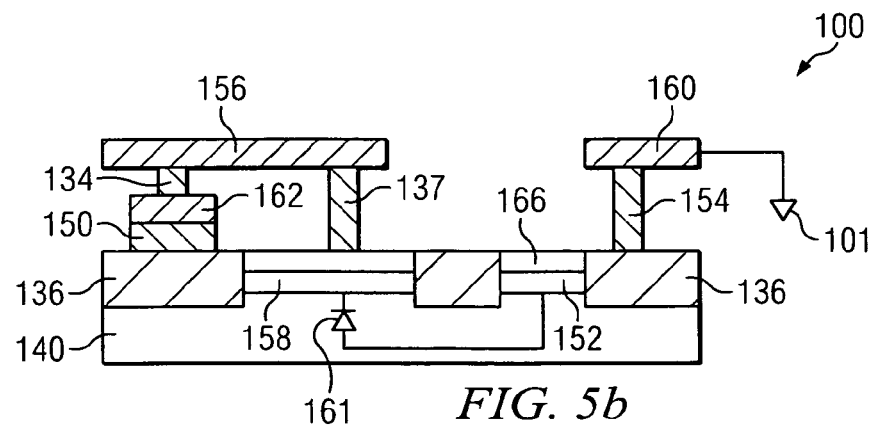

Another embodiment of the invention is shown in FIGS. 5a-5b. Instead of using a polysilicon diode embedded in the gate region, a substrate diode 161 or a well diode is used (see FIG. 5b).

FIG. 5a shows a layout view of the other embodiment. The layout comprises a source region 108, and drain region 102, a gate 150 and doped regions 158 that form either the anode or cathode of a substrate or a well diode. The gate 150 can be made from polysilicon, metal, or silicide. A substrate or well tie 152 is provided to form a current path to a supply. Connector 156, e.g., couples the gate region 150 to the highly doped region 158.

In an NMOS implementation of the other embodiment of the invention, drain/source regions 102/108 comprise n-type regions, doped regions 158 comprise n-type material, and the substrate tie 152 comprises a p-type region that contacts the p-substrate or a p-well 140. A diode is formed at the interface between the silicided n-type region 158 and the underlying p-well or p-substrate, whereby the silicided n-type region 158 forms the cathode and the p-well or p-substrate forms the anode. The p-type substrate/p-well tie region 152 is typically connected to ground 101 via contacts 154.

Alternatively, in a PMOS implementation of the other embodiment of the invention, drain/source regions 102/108 comprise p-type regions, doped regions 158 comprise p-type material, and the well tie 152 comprises an n-type region that contacts an n-well. A diode is formed at the interface between the p-type region 158 and the underlying n-well, whereby the silicided p-type doped region 158 forms the anode and the n-well forms the cathode. The n-type n-well tie region is typically coupled to a supply voltage via contacts 154 instead of to ground 101 as is shown in FIG. 5a.

Turning to FIG. 5b, a cross section of the layout view depicted in FIG. 5a is shown drawn along the length of metallic line 156. In the figure, gate region 150 is shown disposed over STI region 136 because the cross section is taken outside of the active area. The gate region 150 preferably comprises a silicided region 162 on which a contact 134 is disposed coupled to metallic connection 156. The metallic connection 156 is coupled to a doped region 158 via contact 137. Doped region 158 preferably comprises a silicided region disposed on the surface. The interface between well/substrate 140 and the doped region 158 comprises a diode 161. The well/substrate tie region 152 is disposed over the well/substrate region and typically comprises a silicided region disposed on its surface. The well/substrate tie region 152 is electrically coupled to a metallic connection 160 via contact 154.

FIG. 5b is drawn in assuming that the ESD device utilizes an NMOS transistor. The diode 161 is drawn with the cathode being the doped region 158 comprising n-type material and the well/substrate comprising p-type material. In an alternate embodiment where a PMOS transistor is used, the doped region 158 comprises a p-type material and the substrate/well region 140 comprises an n-type material. The polarity of diode 161 would be reversed.

Figure 6A:
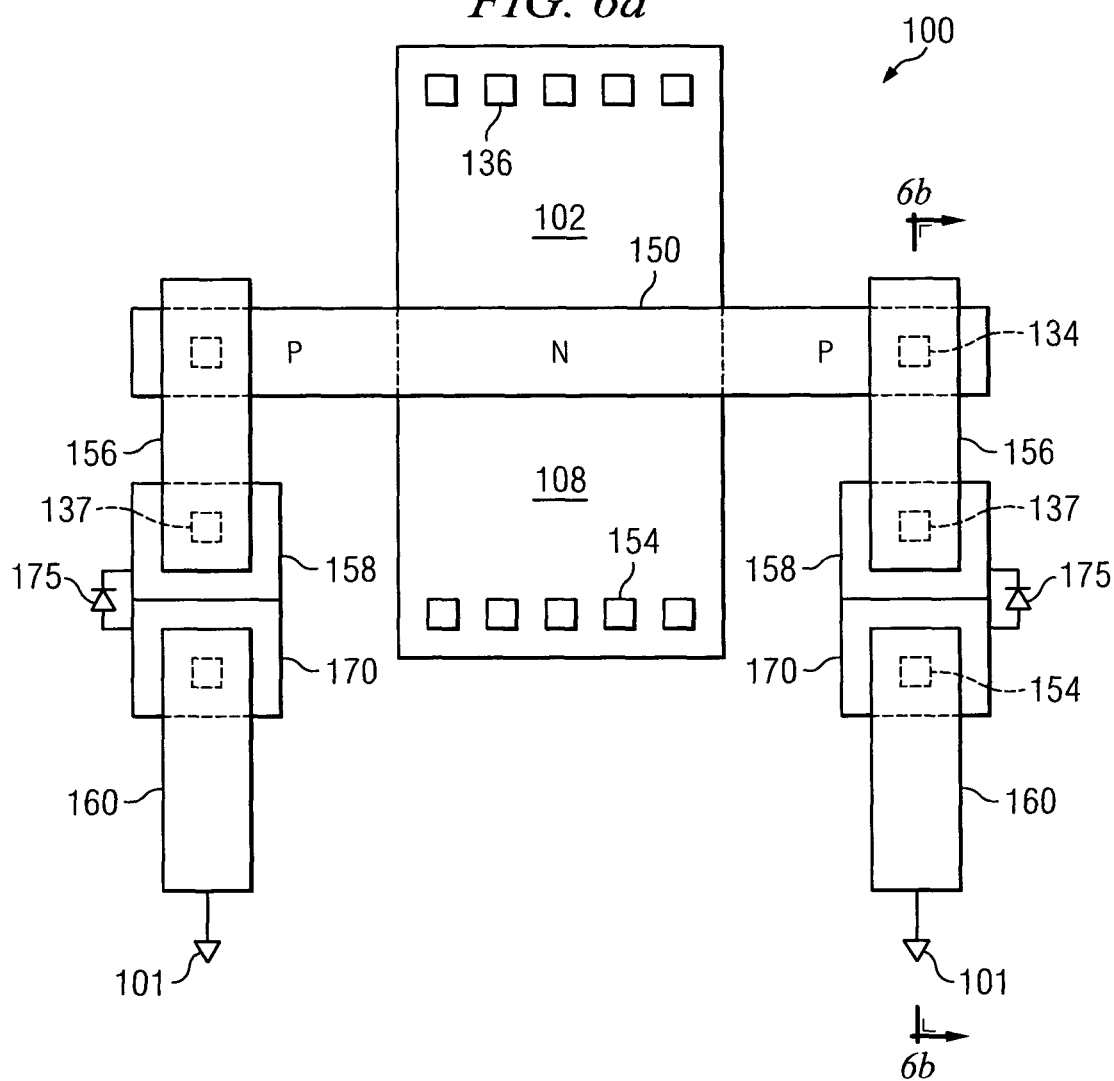
FIGS. 6a-6b contain a layout view and a cross sectional view of a further embodiment ESD structure.
Figure 6B:
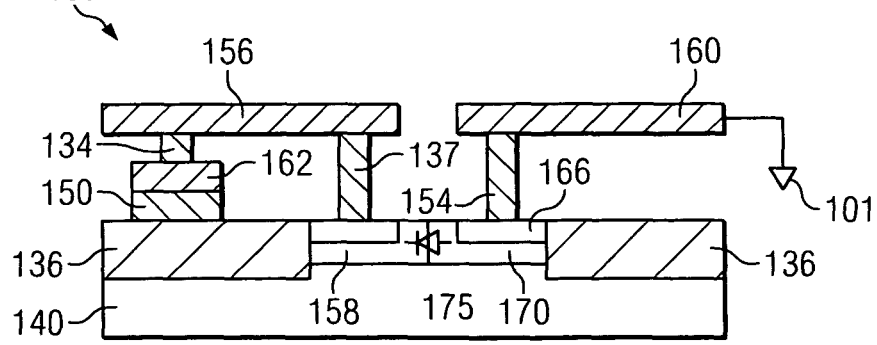

A further embodiment of the invention is shown in FIGS. 6a-6b. In the further embodiment of the invention, an n+/p+ diode is used to couple the gate of device 100 to ground 101 as shown in the layout view of FIG. 6a and in the cross-sectional view of FIG. 6b. The n+/p+ diode 175 is comprised of heavily doped region 158 of one polarity and heavily doped region 170 of the opposite polarity. The high reverse leakage current of the n+/p+ diode ensures that the gate of transistor is discharged after an ESD event.

In the case of an NMOS device, the heavily doped region 158 comprises n-type material and heavily doped region 170 comprises p-type material. The gate 150 is coupled to the n+ cathode of the n+/p+ diode 175. The p+ anode of n+/p+ diode 170 is coupled to ground 101.

In the case of a PMOS device, on the other hand, the heavily doped region 158 comprises p-type material and the heavily doped region 170 comprises n-type material. The gate 104 is coupled to the anode of the n+/p+ diode 175. The polarity of the diodes depicted in FIGS. 6a-6b are reversed when a PMOS ESD transistor is used, and a supply connection would be used instead of the ground connection 101 shown in FIGS. 6a and 6b. The n+ cathode of the n+/p+ diode 170 is coupled to a supply or reference voltage instead of the ground 101 connection shown in FIGS. 6a and 6b.

The invention has been described thus far with respect to specific implementations. It should be clear that variations are possible without departing from the inventive concepts. As one example, while the diagram of FIG. 3a shows only one diode coupled between the gate 104 and ground 101, it is understood that in other embodiments of the present invention, other electrical components, such as diodes and resistors, may be in series with the diode 141. Furthermore, while the illustration shows that the source 108 is coupled directly to ground 101, it is understood that in some embodiments of the present invention, other components and devices may be in series with the source 108 and ground 101.

Figure 7A:
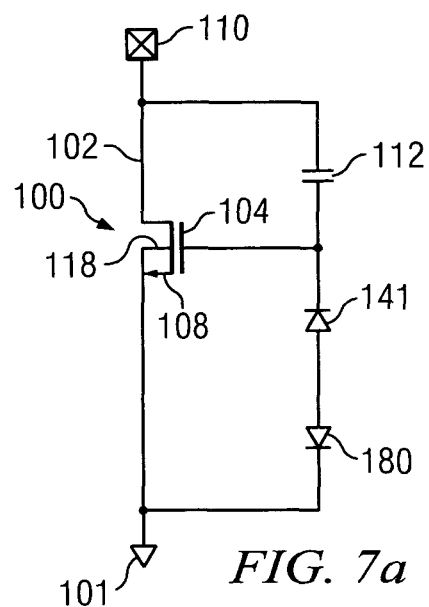
FIGS. 7a-7b contain a circuit diagram a cross sectional view of yet another embodiment ESD structure.
Figure 7B:
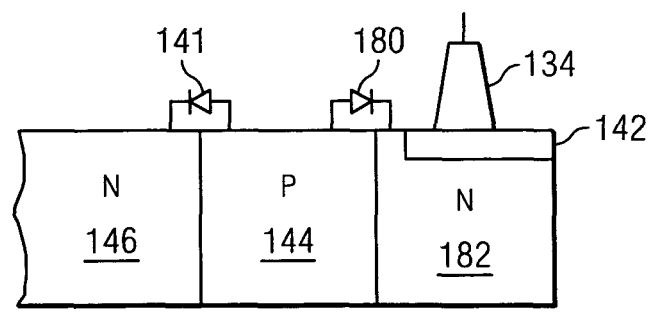

An example of such a modified circuit is shown in FIGS. 7a-7b. As shown in FIG. 7a, this circuit is similar in structure and operation to the embodiment of FIG. 3a described herein above, except that in addition to polysilicon diode 141, there is a second polysilicon diode 180 coupled in series. The cross sectional view in FIG. 7b shows a portion of the gate comprising an n-type polysilicon region 146, a p-type polysilicon region 144, and a second n-type polysilicon region 182. In some embodiments, a silicided region 142 is disposed on top of the second n-type polysilicon region and a contact 134 is disposed thereon.

The embodiment shown in FIGS. 7a-7b assumes that an NMOS transistor is used. In the case of a PMOS transistor, however, the polarity of the diodes would be reversed, and region 146 and region 182 would comprise p-type regions and region 144 would comprise an n-type region.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   a semiconductor body of a first conductivity type;
   a doped drain region of a second conductivity type disposed at a surface of the semiconductor body, the second conductivity type opposite to the first conductivity type;
   a doped source region of the second conductivity type disposed at the surface of the semiconductor body and laterally spaced from the doped drain region by a channel region of the first conductivity type extending entirely from a first edge of the doped drain region to a second edge of the doped source region;
   a gate region of the second conductivity type insulatively overlying at least the entire channel region of the first conductivity type;
   a first region of the first conductivity type disposed directly adjacent to the gate region of the second conductivity type, wherein an entire interface between the first region of the first conductivity type and the gate region of the second conductivity type forms a first semiconductor junction, wherein no portion of the first semiconductor junction is disposed over the doped drain region, the doped source region, the channel region of the first conductivity type, the first edge, and the second edge, and wherein the first region of the first conductivity type and the gate region of the second conductivity type form a contiguous region;
   a signal pad disposed on the semiconductor body, wherein the signal pad is coupled to the doped drain region; and
   wherein the first region of the first conductivity type is coupled to the doped source region such that there is a direct current path between the doped source region and the gate region.

2. The semiconductor device of claim 1, wherein the first region of the first conductivity type is directly coupled to the doped source region, and the first region of the first conductivity type is directly coupled to the gate region.

3. The semiconductor device of claim 1, further comprising a second region of the second conductivity type disposed adjacent to the first region of the first conductivity type, wherein the interface between the first region of the first conductivity type and the second region of the second conductivity type forms a second semiconductor junction.

4. The semiconductor device of claim 3, further comprising a silicided region disposed over a portion of the second region of the second conductivity type, wherein the silicided region does not extend over the second semiconductor junction.

5. The semiconductor device of claim 1, further comprising a silicided region disposed over a portion of the first region of the first conductivity type, wherein the silicided region does not extend over the first semiconductor junction.

6. The semiconductor device of claim 2, further comprising a silicided region touching a portion of the first region of the first conductivity type, wherein the silicided region does not extend over the first semiconductor junction.

7. The semiconductor device of claim 6, wherein the gate region further comprises an n-type, p-type or intrinsic region disposed adjacent to the first region of the first conductivity type, and wherein the silicided region extends over at least a portion of the n-type, p-type, or intrinsic region.

8. The semiconductor device of claim 5, wherein the first conductivity type is p-type, and the second conductivity type is n-type.

9. The semiconductor device of claim 5, wherein the first conductivity type is n-type, and the second conductivity type is p-type.

10. The semiconductor device of claim 1, wherein the contiguous region comprises a polysilicon region.

11. The semiconductor device of claim 1, wherein the first semiconductor junction is disposed over shallow trench isolation (STI).

12. A semiconductor device comprising:
    a channel region of a first conductivity type;
    a source region of a second conductivity type adjacent to the channel region at a first boundary, the second conductivity type opposite the first conductivity type;
    a drain region of the second conductivity type adjacent to the channel region at a second boundary opposite the source region; and
    a gate region comprising:
      a first portion overlying at least the entire channel region, the first portion comprising a gate material only of the second conductivity type, the first portion having a first edge along a width of the source region and a second edge along a width of the drain region, and
      a second portion abutting the first portion at a further edge of the first portion, wherein,
        the further edge of the first portion is not disposed over the channel region, the source region, the drain region, the first boundary and the second boundary,
      the second portion comprises a gate material only of the first conductivity type, and the second portion is coupled to the source region, such that there is a direct current path between the second portion and the source region.

13. The semiconductor device of claim 12, wherein the gate region further comprises a third portion abutting the first portion opposite the second portion, the third portion comprising a gate material of the first conductivity type, wherein the third portion is coupled to the drain region, such that there is a direct current path between the third portion and the drain region.

14. The semiconductor device of claim 12, wherein
    the first portion of the gate region and the second portion of the gate region comprise a contiguous layer of doped polysilicon;
    the first portion of the gate region is doped with a dopant of the second conductivity type; and
    the second portion of the gate region is doped with a dopant of the first conductivity type.

15. The semiconductor device of claim 14, wherein the first conductivity type is p-type, and the second conductivity type is n-type.

16. The semiconductor device of claim 12, further comprising circuitry to be ESD protected, the circuitry coupled to the drain region.

17. The semiconductor device of claim 12, wherein a boundary between the first portion and the second portion of the gate region comprises a diode junction.

18. The semiconductor device of claim 12, wherein the further edge is disposed over shallow trench isolation (STI).

* * * * *